(12) United States Patent
Kobayashi

(10) Patent No.: US 6,806,560 B2
(45) Date of Patent: Oct. 19, 2004

(54) SEMICONDUCTOR DEVICE AND METHOD FOR FABRICATING SAME

(75) Inventor: Yutaka Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/893,791

(22) Filed: Jun. 29, 2001

(65) Prior Publication Data
US 2002/0003293 A1 Jan. 10, 2002

(30) Foreign Application Priority Data
Jul. 4, 2000 (JP) .................................... 2000-202690

(51) Int. Cl.⁷ ............................................ H01L 23/495
(52) U.S. Cl. .................... 257/676; 257/687; 257/690; 257/701; 257/738
(58) Field of Search ................................ 257/676, 687, 257/690, 786, 778–783, 789, 798, 701, 738

(56) References Cited

U.S. PATENT DOCUMENTS

| | | | | |
|---|---|---|---|---|
| 4,786,545 A | * | 11/1988 | Sakuma et al. | 428/209 |
| 5,055,321 A | * | 10/1991 | Enomoto et al. | 427/98 |
| 5,278,429 A | * | 1/1994 | Takenaka et al. | 257/678 |
| 5,473,512 A | * | 12/1995 | Degani et al. | 361/760 |
| 5,519,251 A | * | 5/1996 | Sato et al. | 257/666 |
| 5,756,380 A | * | 5/1998 | Berg et al. | 438/126 |
| 5,816,478 A | * | 10/1998 | Kaskoun et al. | 228/180.22 |
| 5,834,832 A | * | 11/1998 | Kweon et al. | 257/676 |
| 5,872,399 A | * | 2/1999 | Lee | 257/738 |
| 5,925,403 A | * | 7/1999 | Yoshizawa et al. | 427/126.3 |
| 6,197,615 B1 | * | 3/2001 | Song et al. | 438/111 |
| 6,286,207 B1 | * | 9/2001 | Oura et al. | 29/846 |
| 6,288,451 B1 | * | 9/2001 | Tsao | 257/778 |
| 6,323,542 B1 | * | 11/2001 | Hashimoto | 257/669 |
| 6,344,753 B1 | * | 2/2002 | Takada et al. | 324/755 |

FOREIGN PATENT DOCUMENTS

| | | | |
|---|---|---|---|
| JP | 63-94646 | | 4/1988 |
| JP | 04-056347 | | 5/1992 |
| JP | 05-166976 | | 7/1993 |
| JP | 09148374 A | * | 6/1997 |
| JP | 10-256458 | | 9/1998 |
| JP | 2973988 | | 9/1999 |
| JP | 11-243162 | | 9/1999 |
| JP | 11-345918 | | 12/1999 |

* cited by examiner

Primary Examiner—Tom Thomas
Assistant Examiner—Chris C. Chu
(74) Attorney, Agent, or Firm—McGinn & Gibb, PLLC

(57) ABSTRACT

Lands and Cu wirings are formed on surfaces of a glass epoxy substrate, and a solder mask is formed on the lands and the Cu wirings to form a chip-mounting substrate. A bottom surface of the chip-mounting substrate is made rough, and a semiconductor chip is mounted on a top surface of the chip-mounting substrate. Through holes communicating with the Cu wirings are formed on the solder mask to expose the Cu wirings. Solder balls are formed on the Cu wrings by thermal compression welding. Underfill material is injected into a clearance formed between the chip mounting substrate and a printed circuit board. Since the surface of the chip-mounting substrate is made rough, an area of a contact surface between the chip-mounting substrate and underfill material increases, hence an adhesive strength between the chip-mounting substrate and the printed circuit board is heightened.

11 Claims, 9 Drawing Sheets

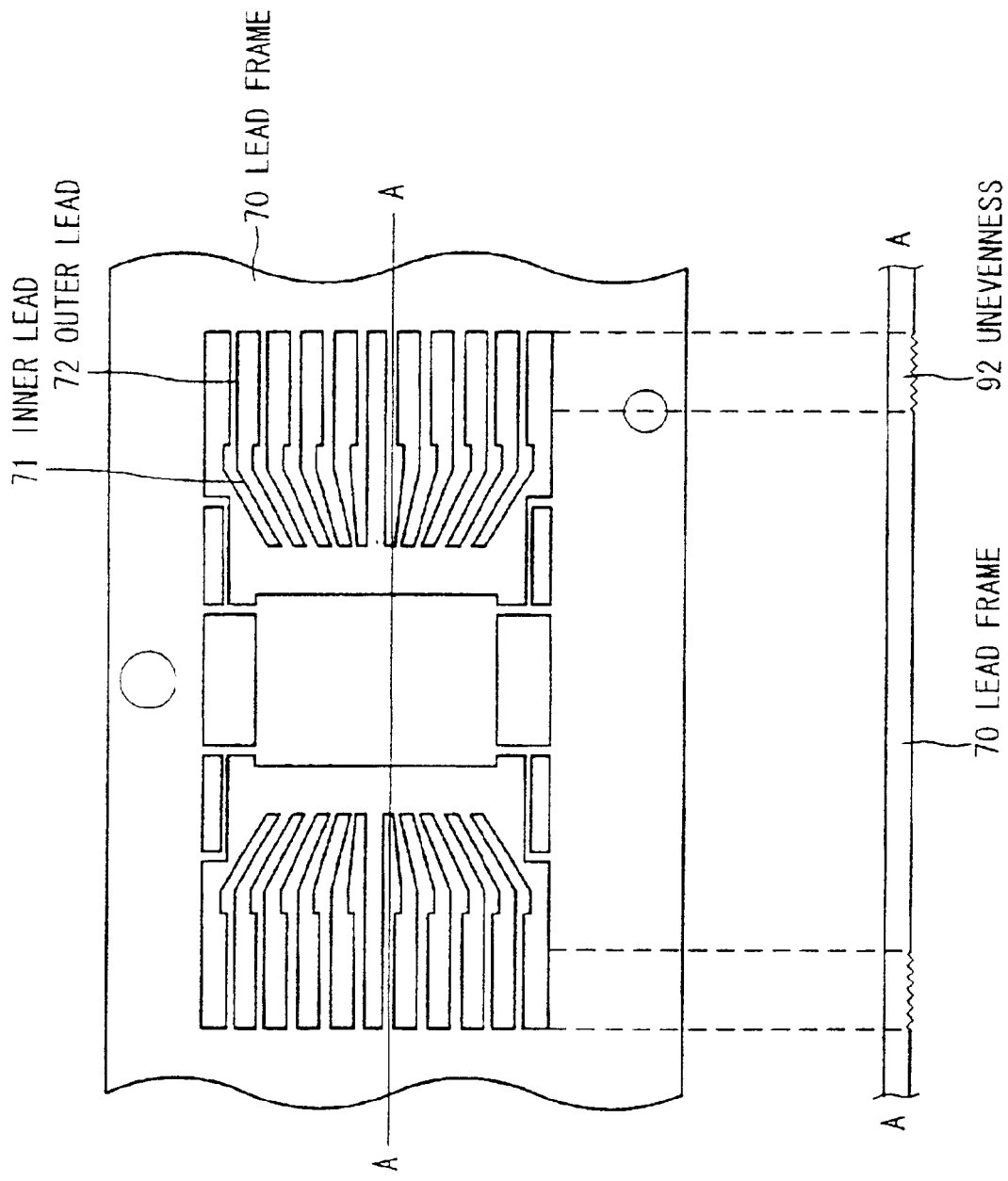

SEMICONDUCTOR DEVICE AND METHOD FOR FABRICATING SAME

FIELD OF THE INVENTION

The invention relates to a semiconductor device and a method for fabricating the same, and especially to a semiconductor device in which a semiconductor chip is assembled into a printed circuit board and a method for fabricating the same.

BACKGROUND OF THE INVENTION

In recent years, an electronic device has come to be integrated with high density, and a semiconductor chip with multiple terminals is packaged in accordance with an improvement of the function and thinning of an electronic circuit. Accordingly, a package of the semiconductor chip used in the electronic circuit is miniaturized and provided with multiple pins. In conformity with the aforementioned tendency, the semiconductor chip is assembled into a printed circuit board by means of a package of an area array type, such as a ball grid array package (BGA), a chip scale package (CSP) or a bare chip package (a flip chip package, FC).

FIG. 1 shows a typical example of the structure of the aforementioned packages of the semiconductor chips. In the package shown in FIG. 1, a chip-mounting substrate 103 on which a semiconductor chip 100 has been mounted by means of wire-bonding is assembled into a printed circuit board 104 by CSP, where the chip-mounting substrate 103 is composed of an insulating substrate 101 formed of ceramics, polyimide, etc. and conductor wirings 102.

In the package having the aforementioned structure, a clearance formed between the chip-mounting substrate 103 and the printed circuit board 104 is filled with underfill material 105 in order to absorb a stress caused by a difference in the thermal expansion coefficient between the chip-mounting substrate 103 and the printed circuit board 104 and impacts caused by fallings to secure the reliability of soldered jointed portions.

However, if alien substances mix with underfill material 105 or the impacts exert on under fill material 105 for a long period of time, an adhesive strength of underfill material 105 is lowered, and underfill material 105 may exfoliate form the surface of the chip-mounting substrate 103 or of the printed circuit board 104.

If underfill material 105 exfoliates from the chip-mounting substrate 103 or the printed circuit board 104, since the stress concentrates on joined portions of the solder balls 106, cracks occur on pads 107, 108 which are respectively formed on surfaces of the chip-mounting substrate 103 and the printed circuit board 104, and the joined portions become disincentive. As mentioned in the above, the reliability of the semiconductor device is lowered because of lowering of the adhesive strength of underfill material 105.

In Japanese Patent Applications, Laid-Open, No.63-94646, an electronic device in which unevennesses are respectively provided for a predetermined part of a chip-mounting substrate and sealing resin for sealing a semiconductor chip is disclosed as a means for increasing an adhesive strength between the chip-mounting substrate and the basic substrate. That is to say, in the aforementioned semiconductor device, concave portions and convex portions are alternately formed on the chip-mounting substrate and on sealing resin for covering the semiconductor chip, and the chip-mounting substrate on which the semiconductor chip is mounted is buried in a cavity formed in the basic substrate. Accordingly, the aforementioned technology cannot be applied to a package of an area array type.

Although a semiconductor device in which a bonding wire is prevented from being disincentive by providing unevenness for a pad is disclosed in Japanese Patent No.2973988, underfill material is not prevented from being exfoliated according to this technology.

In a semiconductor device in which a semiconductor chip mounted on a lead frame is assembled into a printed circuit board, since there is a difference in a thermal expansion coefficient between the lead frame and a pad of the printed circuit board, the lead frame may exfoliate from the printed circuit board at a contact surface therebetween because of an impact caused by a thermal shock.

SUMMARY OF THE INVENTION

Accordingly, it is an object of the invention to provide a semiconductor device in which a chip-mounting substrate or a lead frame adheres to a printed circuit board tightly, and a method for fabricating the same.

It is a further object of the invention to provide a semiconductor device operating in an electronic circuit with high reliability, and a method for fabricating the same.

A semiconductor device concerned with the first viewpoint of the invention comprises:

a semiconductor chip, a chip-mounting substrate which is provided with the semiconductor chip mounted on a top surface thereof and the first conductive pads formed on a bottom surface thereof and connected with the semiconductor chip electrically, solder balls formed on the first conductive pads, a printed circuit board on which second conductive pads connected with the solder balls are formed, and underfill material injected into a clearance formed between the chip-mounting substrate and the printed circuit board, wherein unevenness is formed on a surface which is brought into contact with the underfill material of at least one of the chip-mounting substrate and the printed circuit board.

According to the aforementioned structure, since an area of a contact surface between the chip-mounting substrate and underfill material increases, an adhesive strength between the chip-mounting substrate and underfill material is heightened. Accordingly, the chip-mounting substrate becomes hard to exfoliate from underfill material, and an adhesive strength between the chip-mounting substrate and the printed circuit board is heightened. Moreover, since the adhesive strength between the chip-mounting substrate and the printed circuit board is heightened, a disconnection between the solder ball and the pad becomes hard to occur. Accordingly, the semiconductor device operating in the electronic circuit with high reliability can be obtained.

The aforementioned unevenness may be selectively formed on the first conductive pads or on the second conductive pads.

Moreover, the aforementioned unevenness may be shaped into a slit-like configuration or into a dimple-like configuration.

A semiconductor device concerned with the second view point of the invention comprises:

a semiconductor chip, a lead frame which is provided with the semiconductor chip mounted thereon and electrically connected with the semiconductor chip, and a printed circuit board including the third conductive pads which are formed thereon and brought into contact with the lead frame, wherein at least one of the lead frame and the printed circuit board is provided with unevennesses at contact surfaces therebetween.

According to the aforementioned structure, since an area of a contact surface between the lead frame and the printed circuit board increases, the lead frame becomes hard to exfoliate from the printed circuit board, and the adhesive strength between the lead frame and the printed circuit board is heightened. Moreover, since the adhesive strength between the lead frame and the printed circuit board is heightened, a jointed portion between the lead frame and the printed circuit board becomes hard to be disincentive. Accordingly, the semiconductor device operating in the electronic circuit with high reliability can be obtained.

A method for fabricating a semiconductor device concerned with the third viewpoint of the invention comprises the steps of:

forming the fourth conductive pads on a bottom surface of a chip-mounting substrate, forming unevenness on the bottom surface of the chip-mounting substrate, mounting a semiconductor chip on a top surface of the chip-mounting substrate, connecting the semiconductor chip with the fourth conductive pads electrically, forming solder balls on the fourth conductive pads, assembling the chip-mounting substrate into a printed circuit board by connecting solder balls with the fifth conductive pads formed on the printed circuit board, and injecting underfill material into a clearance formed between the chip-mounting substrate and the printed circuit board.

According to the aforementioned structure, since an area of a contact surface between the chip-mounting substrate and underfill material increases, the adhesive strength between the chip-mounting substrate and underfill material is heightened. Accordingly, the chip-mounting substrate becomes hard to exfoliate from underfill material, and the adhesive strength between the chip-mounting substrate and the printed circuit board is heightened. Moreover, since the adhesive strength between the chip-mounting substrate and the printed circuit is heightened, a disconnection between the solder ball and the pad becomes hard to occur. Accordingly, the semiconductor device operating in the electronic circuit with high reliability can be obtained.

The aforementioned step of forming unevenness on the bottom surface of the chip mounting substrate may comprise the step of forming unevennesses on the fourth conductive pads.

A method for fabricating the semiconductor device concerned with the fourth view point of the invention comprises the steps of:

forming the sixth conductive pads on a bottom surface of a chip-mounting substrate, mounting a semiconductor chip on a top surface of the chip-mounting substrate, connecting the semiconductor chip with the sixth conductive pads electrically, forming solder balls on the sixth conductive pads, forming unevenness on a surface of a printed circuit board on which the seventh conductive pads are formed, assembling the chip-mounting substrate into the printed circuit board by connecting the solder balls with the seventh conductive pads formed on the printed circuit board, and injected underfill material into a clearance formed between the chip-mounting substrate and the printed circuit board.

According to the aforementioned structure, since an area of the contact surface between the printed circuit board and underfill material increases, the adhesive strength between the printed circuit board and underfill material is heightened. Accordingly, underfill material becomes hard to exfoliate from the printed circuit board, and the adhesive strength between the chip-mounting substrate and the printed circuit board is heightened. Moreover, since the adhesive strength between the chip-mounting substrate and the printed circuit board is heightened, a disconnection between the solder ball and the pad becomes hard to occur. Accordingly, the semiconductor device operating in the electronic circuit with high reliability can be obtained.

The step of forming unevenness on the surface of the printed circuit board may comprise the step of forming unevennesses on the surfaces of the seventh conductive pads selectively.

A method for fabrication a semiconductor device concerned with the fifth view point of the invention comprises the steps of:

forming the eighth conductive pads on a bottom surface of a chip-mounting substrate, forming the first unevenness on a bottom surface of the chip-mounting substrate, mounting a semiconductor chip on a top surface of the chip-mounting substrate, connecting the semiconductor chip with the eighth conductive pads electrically, forming solder balls on the eighth conductive pads, forming the second unevenness on a surface of a printed circuit board on which the ninth conductive pads are formed, assembling the chip-mounting substrate into the printed circuit board by connecting the solder balls with the ninth conductive pads, and injecting underfill material into a clearance formed between the chip-mooting substrate and the printed circuit board.

According to the aforementioned structure, since an area of a contact surface between the chip-mounting substrate and underfill material increases, the adhesive strength therebetween is heightened. Similarly, since an area of a contact surface between the printed circuit board and underfill material increases, the adhesive strength therebetween is heightened also. Accordingly, underfill material becomes hard to exfoliate from both the chip-mounting substrate and the printed circuit board, and the adhesive strength between the chip-mounting substrate and the printed circuit board is heightened. Moreover, since the adhesive strength between the chip-mounting substrate and the printed circuit board is heightened, a disconnection between the solder ball and the pad becomes hard to occur. As a result, the semiconductor device operating in the electronic circuit with high reliability can be obtained.

The step of forming unevenness on the bottom surface of the chip-mounting substrate may comprise the step of forming unevennesses on the surfaces of the eighth conductive pads selectively, and The step of forming unevenness on the top surface of the printed circuit board may comprise the step of forming unevennesses on the surfaces of the ninth conductive pads selectively.

A method for fabricating a semiconductor device concerning with the sixth view point of the invention comprises the steps of:

forming unevennesses on predetermined parts of a lead frame, mounting a semiconductor chip on the lead frame, connecting the semiconductor chip with the lead frame electrically, and assembling the lead frame on which the semiconductor chip is mounted into a printed circuit board by bringing the unevennesses formed on the lead frame into contact with tenth conductive pads formed on the printed circuit board.

According to the aforementioned structure, since areas of the contact surfaces between the lead frame and the printed circuit board increase, the lead frame becomes hard to exfoliate from the printed circuit board, and the adhesive strength between the lead frame and the printed circuit board is heightened. Moreover, since the adhesive strength between the lead frame and the printed circuit board is heightened, a disconnection of a jointed portion between the lead frame and the printed circuit board becomes hard to occur. Accordingly, the semiconductor device operating with high reliability n the electronic circuit can be obtained.

A method for fabricating a semiconductor device concerned with the seventh view point of the invention comprises the steps of:

mounting a semiconductor chip on a lead frame, forming unevennesses on surfaces of eleventh conductive pads formed on a printed circuit board, and assembling the lead frame on which the semiconductor chip is mounted into the printed circuit board by connecting the lead frame with the eleventh conductive pads on which the unevennesses are formed.

A method for fabricating a semiconductor device concerned with the eighth viewpoint of the invention comprises the steps of:

forming the first unevennesses on predetermined parts of a lead frame, mounting a semiconductor chip on the lead frame, connecting the semiconductor chip with the lead frame electrically, forming the second unevennesses on surfaces of twelfth conductive pads formed on a printed circuit board, and assembling the lead frame on which the semiconductor chip is mounted into the printed circuit board by bringing the first unevennesses formed on the lead frame into contact with the second unevennesses formed on the twelfth conductive pads.

BRIEF DESCRIPTION OF THE DRAWINGS

The invention will be explained in more detail in conjunction with appended drawings, wherein:

FIG. 7A is a plan view of showing a lead frame used in a semiconductor device according to the third preferred embodiment of the invention, FIG. 7B is a cross-sectional view for showing a lead frame used n a semiconductor device according to the third preferred embodiment of the invention.

DESCRIPTION OF THE PREFERRED EMBODIMENTS

Hereafter, preferred embodiments of the invention will be explained.

[The First Preferred Embodiment]

Figure 1:
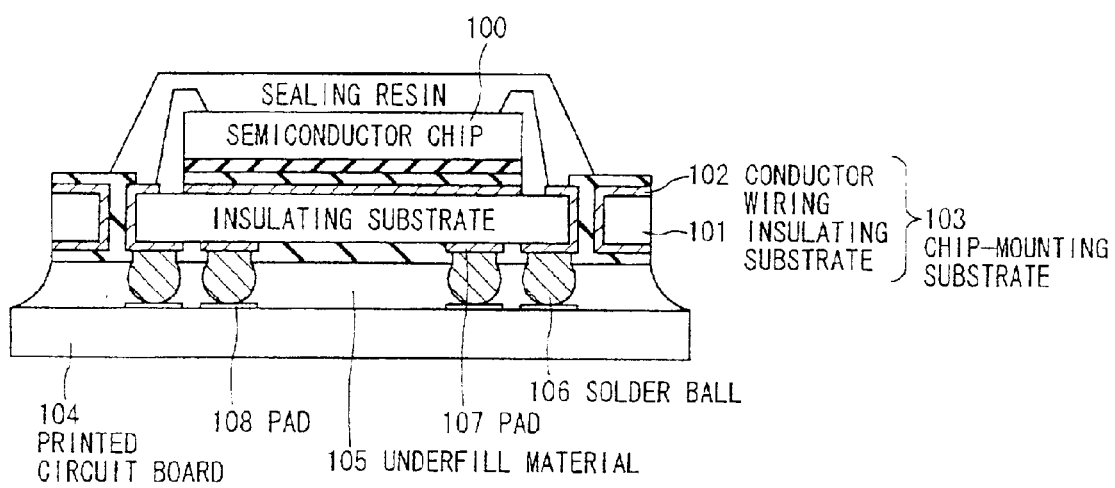
FIG. 1 is a cross-sectional view for showing a conventional semiconductor device.
Figure 2A:
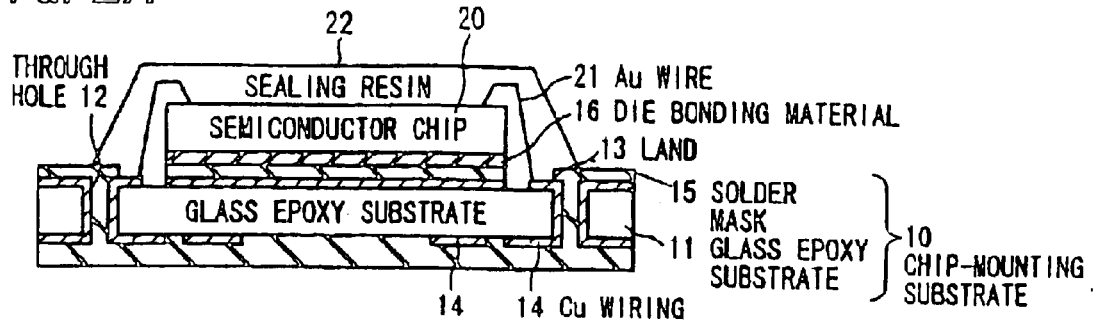
FIGS. 2A to 2D are cross-sectional vies for showing a semiconductor device according to the first preferred embodiment of the invention.
Figure 2B:
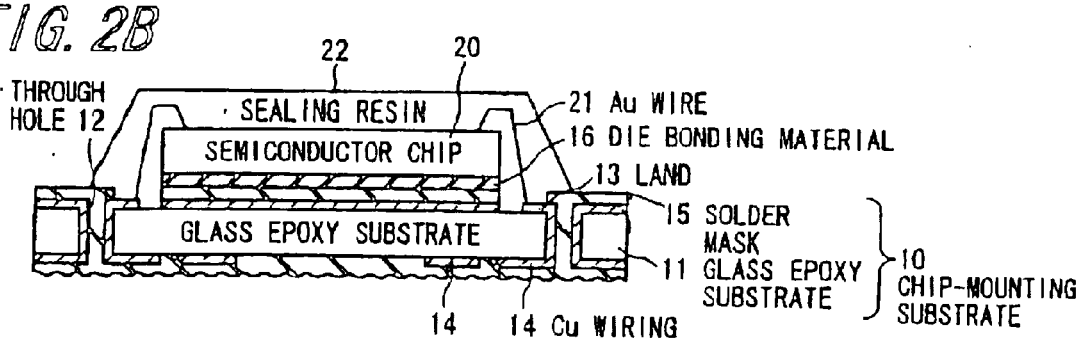
Figure 2C:
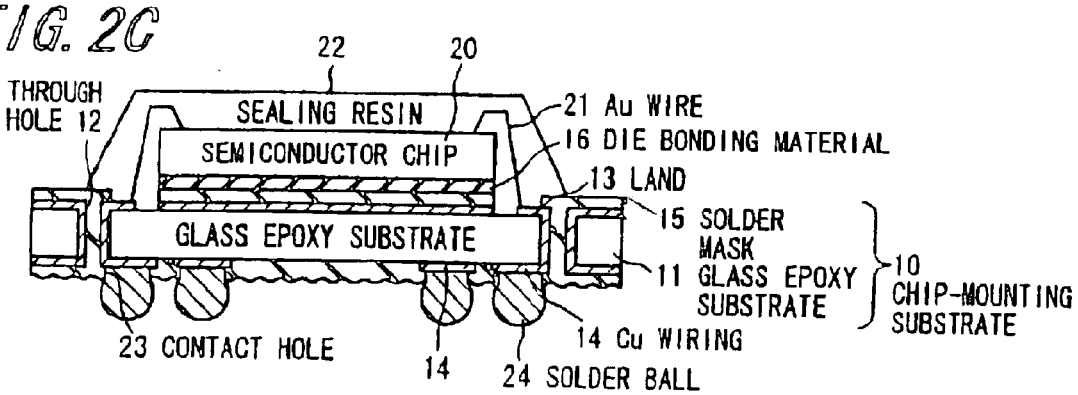
Figure 2D:
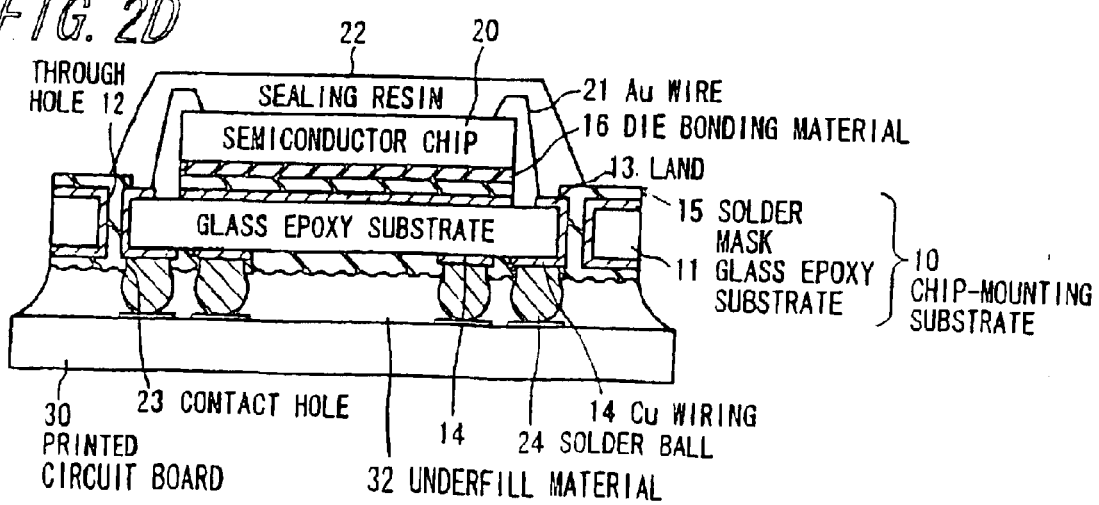

As shown in FIG. 2D, a semiconductor device according to the first preferred embodiment is fabricated by packaging a semiconductor chip in accordance with CSP (chip scale package), and provided with a chip-mounting substrate 10, semiconductor chip 20, and a printed circuit board 30.

The chip-mounting substrate 10 is composed of a glass fiber-reinforced epoxy substrate (a glass epoxy substrate, hereinafter) 11 of a single layer which is provided with plural through holes 12 formed on a periphery thereof, lands 13 formed on a top surface of the glass epoxy substrate 11, Cu wirings (pads) 14 which are formed on a bottom surface of the glass epoxy substrate 11 and connected with the lands 13 via the through holes 12, and solder balls 24 formed on the Cu wirings 14. A solder mask 15 is formed on the Cu wirings 14 and the lands 13. Moreover, unevenness is provided for a bottom surface of the solder mask 15 which is framed on the Cu wirings 14.

A semiconductor chip 20 adheres to a central area of the chip-mounting substrate 10 by means of die bonding material 16, and pads (not shown) formed on the semiconductor chip 20 are connected with the lands 13 by Au wires (bonding wires) 21. Moreover, the semiconductor chip 20, the Au wires 21, and the lands 13 are sealed with sealing resin 22.

A printed circuit board 30 which is opposite the chip-mounting substrate 10 is provided with pads 31, which are respectively connected with the solder balls 24.

A clearance formed between the chip-mounting substrate 10 and the printed circuit board 30 is filled with underfill material 32.

Hereafter, a method for fabricating the semiconductor device will be explained.

As shown in FIG. 2A, the through holes 12 are formed on the periphery of the glass epoxy substrate 11 by means of photolithography and laser beam irradiation. Next, a Cu layer is formed on the surfaces of the glass epoxy substrate 11 including the inner surfaces of the throughout holes 12. Subsequently, the Cu layer is etched to form the lands 13 on the top surface of the glass epoxy substrate 11 and to form the Cu wirings 14 on the bottom surface of the glass epoxy substrate 11. After the lands 13 and the Cu wirings 14 are formed, the solder mask 15 is formed on both the surfaces of the glass epoxy substrate 11 including the inner surfaces of the through holes 12. After the solder mask 15 is formed, the solder mask 15 just above the lands 13 are etched and removed, and the semiconductor chip 20 adheres to the central area of the glass epoxy substrate 11 by means of die boding material 16. Subsequently, the pads formed on the semiconductor chip 20 are respectively connected with the lands 13 by the Au wires 21. Thereafter, the semiconductor chip 20, the Au wires 21, and the lands 13 are sealed with sealing resin 22.

Next, as shown in FIG. 2B, the solder mask 15 formed on the Cu wirings 14 is grinded mechanically by using a buff brush, and made rough. Thereby unevenness is formed on the bottom surface of the chip-mounting substrate 10. Thereafter, the surface of the chip-mounting substrate 10 is washed by cleansing liquid.

Next, in order to form the solder balls 24 on the Cu wirings 14, the solder mask 15 is etched to form contact holes 23 communicating with the Cu wirings 14 as shown in FIG. 2C. Subsequently, the solder balls 24 are formed on the Cu wirings 14 by thermal compression welding.

Next, as shown in FIG. 2D, the chip-mounting substrate 10 is so positioned opposite to the printed circuit board 30 that the solder balls 24 on the chip-mounting substrate 10 are respectively aligned with the corresponding pads 31 on the printed circuit board 30. Then, they are brought into contact with each other, a relow process is conducted, and the solder balls 24 are connected with the pads 31 on the printed circuit board 30.

Finally, underfill material 32 is injected into a clearance formed between the chip-mounting substrate 10 and the printed circuit board 30, and hardened.

As mentioned in the above, since an area of a contact surface between the chip-mounting substrate 10 and underfill material 32 is increased by providing unevenness for the bottom surface of the chip-mounting substrate 10, an adhesive strength between the chip-mounting substrate 10 and underfill material 32 is heightened. Accordingly, underfill material 32 is prevented from being exfoliated from the hip-mounting substrate 10 because of impacts caused by failings, bendings or thermal shocks. As a result, the semiconductor device operating in the electric circuit with high reliability can be obtained.

Although the glass epoxy substrate 11 is used as material of the chip-mounting substrate 10 in the aforementioned embodiment, a plastic substrate, a polyimide tape substrate, or a ceramic substrate can be adopted for the same purpose. Moreover, although Cu is used as material of the wiring and the land, and the Au wire is used as the bonding wire in the aforementioned embodiment, the other materials may be adopted for the same purpose.

Although the solder mask 15 is formed on both the surfaces of the glass epoxy substrate 11 after the lands 13 and the Cu wirings 14 are formed, and the surface of the solder mask 15 is made rough thereafter in the aforementioned embodiment, the solder resist 15 may be replaced with other material so long as it can seal the lands 13 and the Cu wirings 14 airtightly and the surface thereof can be made rough easily.

Although the chip-mounting substrate of a single layer is used in the aforementioned embodiment, the chip-mounting substrate of multi-layers maybe adopted. Moreover, two or more semiconductor chips 20 may be stacked on the chip-mounting substrate 10.

Moreover, although the CSP is adopted in the aforementioned embodiment, a BGA package or a FC package may be adopted in the other embodiment.

Although the chip-mounting substrate 10 is grinded mechanically in the aforementioned embodiment, the chip-mounting substrate 10 may be grinded and made rough chemically by soft etching.

Figure 3A:
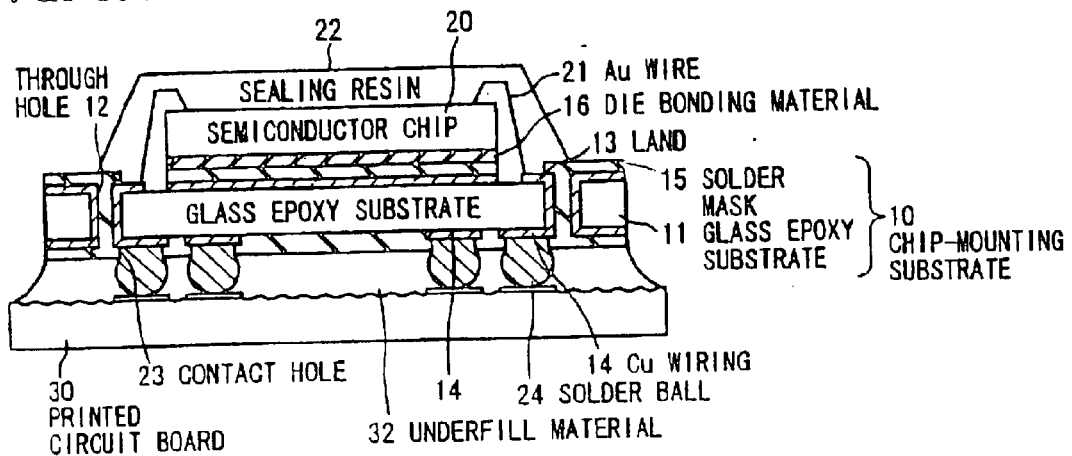
FIGS. 3A, 3B are cross-sectional view for showing modifications of a semiconductor device according to the first preferred embodiment of the invention.
Figure 3B:
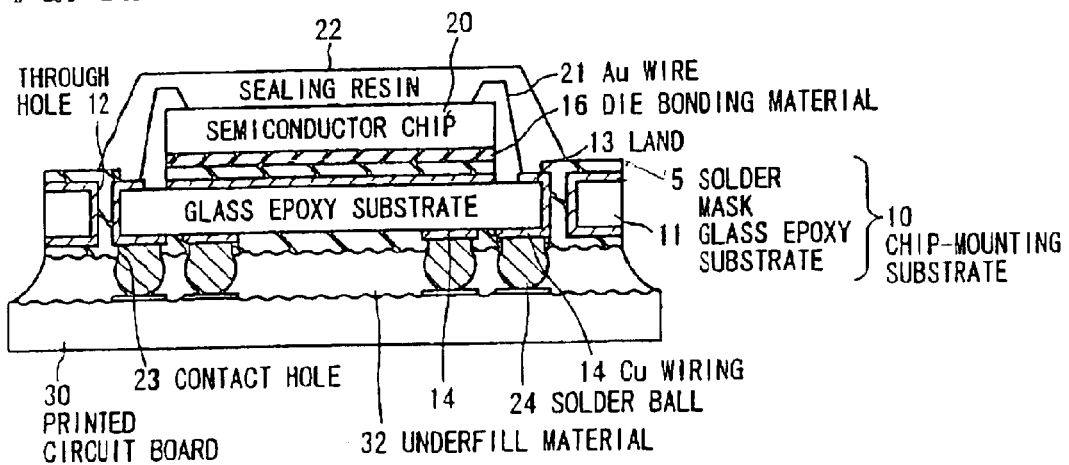

Although the chip-mounting substrate 10 is made rough in the aforementioned embodiment, the printed circuit board 30 may be made rough as shown in FIG. 3A. Moreover, both the chip-mounting substrate 10 and the printed circuit board 30 may be made rough as shown in FIG. 3B.

Figure 4A:
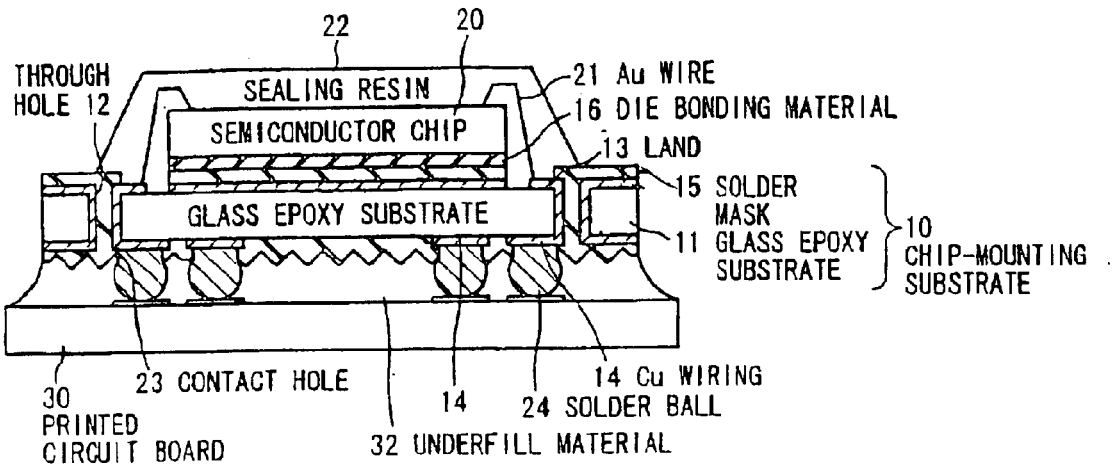
FIGS. 4A, 4B are cross-sectional view for showing modifications of a semiconductor device according to the first preferred embodiment of the invention.
Figure 4B:
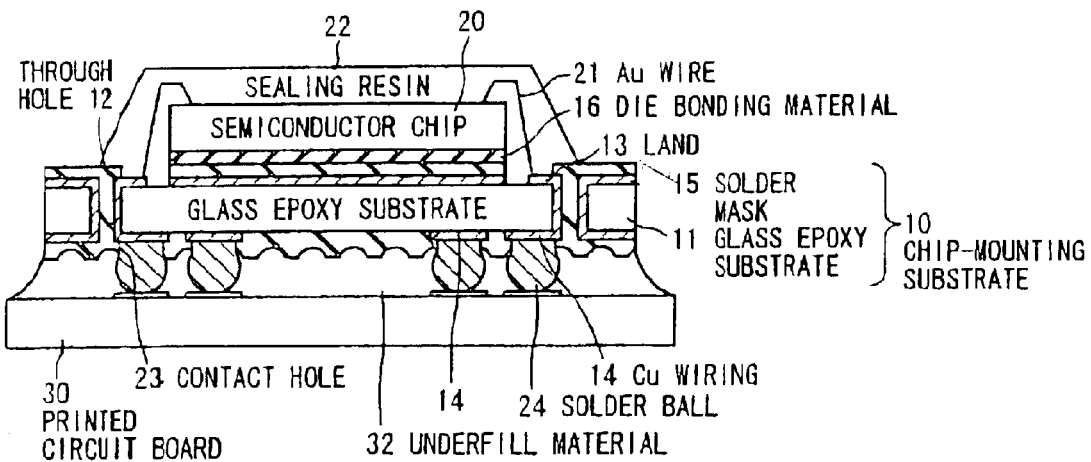

The surface of the chip-mounting substrate 10 or of the printed circuit board 30 may be shaped into a dimple-like configuration or into a slit-like configuration as shown in FIG. 4A or in FIG. 4B instead of making it rough simply.

[The Second Preferred Embodiment]

Next, the second preferred embodiment of the invention will be explained referring to the appended drawings.

Figure 5A:
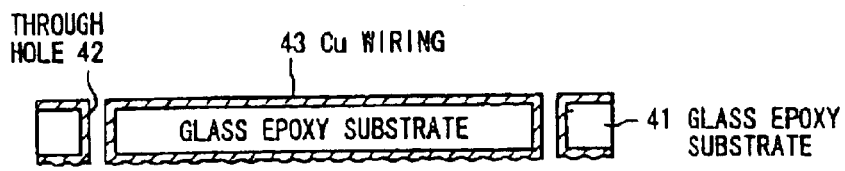
FIGS. 5A to 5D are cross-sectional views for showing a semiconductor device according to the second preferred embodiment of the invention.
Figure 5B:
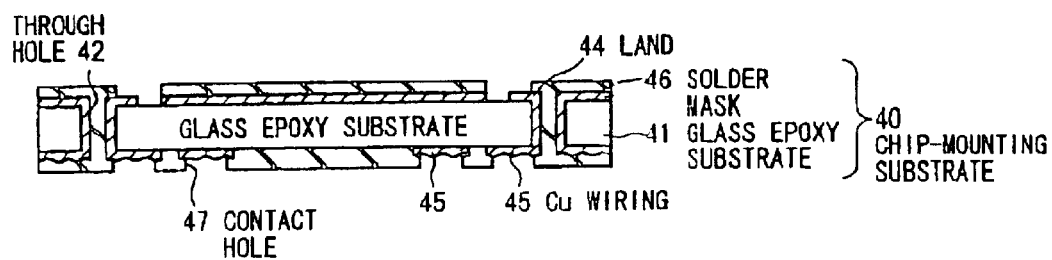
Figure 5C:
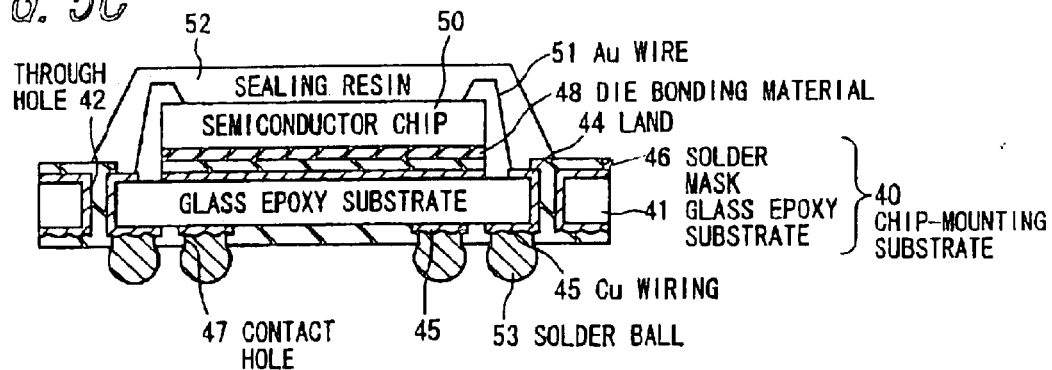
Figure 5D:
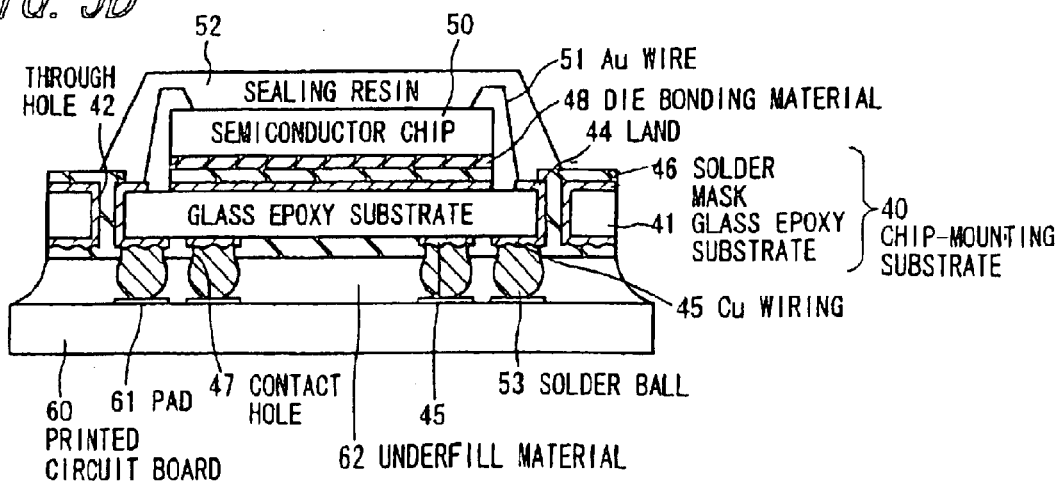

A semiconductor device according to the second preferred embodiment is the same as the semiconductor device according to the first preferred embodiment substantially, and provided with a chip-mounting substrate 40, a semiconductor chip 50, and a printed circuit board 60 as shown in FIG. 5D. However, unevenness is not formed on a surface of the chip-mounting substrate 40 situated opposite to the printed circuit board 60, but on contact surfaces between Cu wirings 45 and solder balls 53.

Next, a method for fabricating the semiconductor device according to the second preferred embodiment will be explained.

First, as shown in FIG. 5A, through holes 42 are formed on a periphery of a glass epoxy substrate 41 by means of photolithography or a laser beam irradiation, and subsequently, a Cu layer 43 is formed on both the surfaces of the glass epoxy substrate 41 including inner surfaces of the through holes 42. Next, a surface of the Cu layer 43 formed on a bottom surface of the glass epoxy substrate 41 (a surface on which Cu wiring layers 45 are to be formed) is grinded mechanically by means of a buff brush, and made rough. Thereafter, the surface of the Cu layer 43 which has been made rough is washed by cleansing liquid.

Next, as shown in FIG. 5B, the Cu layer 43 is etched. Then, lands 44 are formed on a top surface of the glass epoxy substrate 41 (a surface on which the Cu layer 43 is not made rough), and the Cu wirings 45 are formed on the bottom surface of the glass epoxy substrate 41 (the surface on which the Cu layer 43 has been made rough). Subsequently, a solder mask 46 is formed on both the surfaces of the glass epoxy substrate 41. Then, the solder mask 46 formed on the lands 44 and the Cu wirings 45 is etched to form the contact holes 47 communicating with the Cu wirings 45. By the aforementioned process, the Cu wirings 45 are exposed, where the surfaces of the Cu wirings 45 have been made rough.

Next, as shown in FIG. 5C, the semiconductor chip 50 adheres to a central area of the glass epoxy substrate 41 by means of die bonding material 48. Subsequently, pads formed on the semiconductor chip 50 are connected with the lands 44 by Au wires 51, and the semiconductor chip 50, the Au wires 51, and the lands 44 are sealed with resin 52. Thereafter, solder balls 53 are connected with the Cu wirings 45 by thermal compression welding, where the surfaces of the Cu wirings 45 have been made rough beforehand.

Next, as shown in FIG. 5D, in order to assemble the chip-mounting substrate 40 on which the semiconductor chip 50 has been mounted into the printed circuit board 60, the solder balls 53 connected with the chip-mounting substrate 40 are aligned with the corresponding pads 61 formed on the printed circuit board 60, and they are brought into contact with each other.

Finally, underfill material 62 is injected into a clearance formed between the chip-mounting substrate 40 and the printed circuit board 60, and hardened.

As mentioned in the above, since areas of jointed surfaces between the Cu wirings (the pads) 45 and the solder balls 53 increase because of unevennesses provided for the surfaces of the Cu wirings (the pads) 45, the adhesive strengths between the Cu wirings 45 and the solder balls 53 are heightened. As a result, the joined surfaces between the pads 45 and the solder balls 53 are prevented from being cracked by impacts caused by failings, bendings, or thermal shocks. Accordingly, the semiconductor device operating in the electronic circuit with high reliability can be provided.

Although the surface of the Cu layer 43 has been made rough before the Cu wirings 45 are formed in the aforementioned embodiment, a following method may be adopted. That is to say, the solder mask 46 is formed on the Cu wirings 45, the solder mask 46 is etched to expose the surfaces of the Cu wirings 45, and the surfaces of the Cu wirings 45 are made rough thereafter.

Figure 6A:
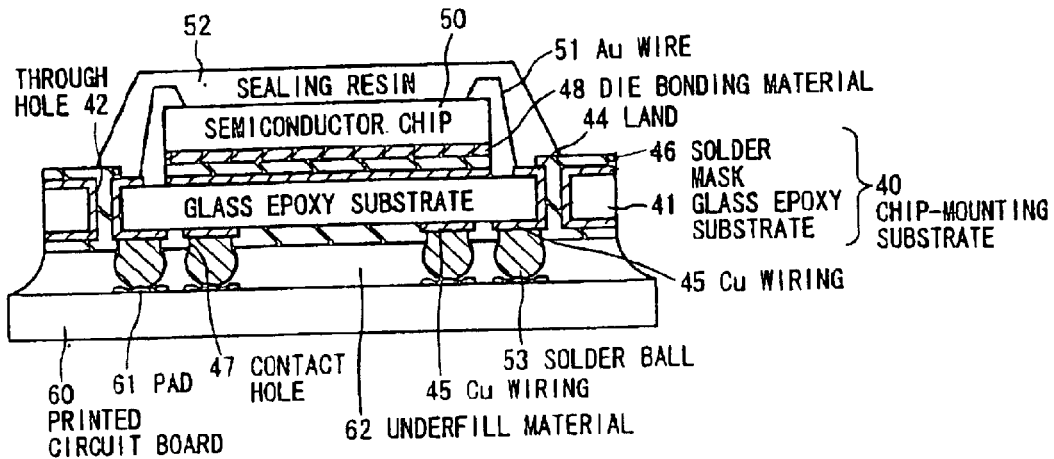
FIGS. 6A, 6B are cross-sectional views for showing modifications of a semiconductor device according to the second preferred embodiment of the invention.
Figure 6B:
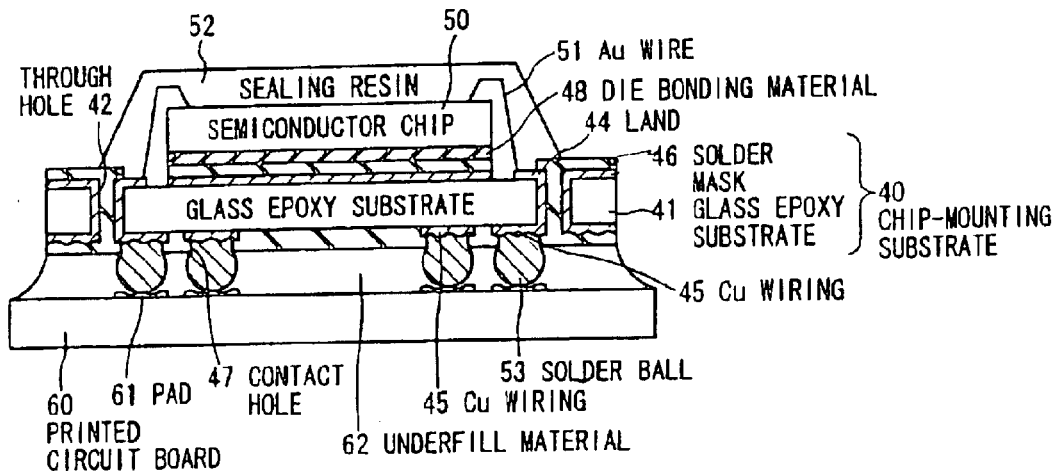

Although unevennesses are provided for the pads 45 formed on the chip-mounting substrate 40 in the aforementioned embodiment, unevennesses may provided for the pads 61 formed on the printed circuit board 60 as shown in FIG. 6A. Moreover, as shown in FIG. 6B, unevennesses may be provided for the pads 45, 61 respectively formed on the chip-mounting substrate 40 and the printed circuit board 60.

[The Third Preferred Embodiment]

Next, the third preferred embodiment of the invention will be explained referring to the appended drawings.

Figure 9A:
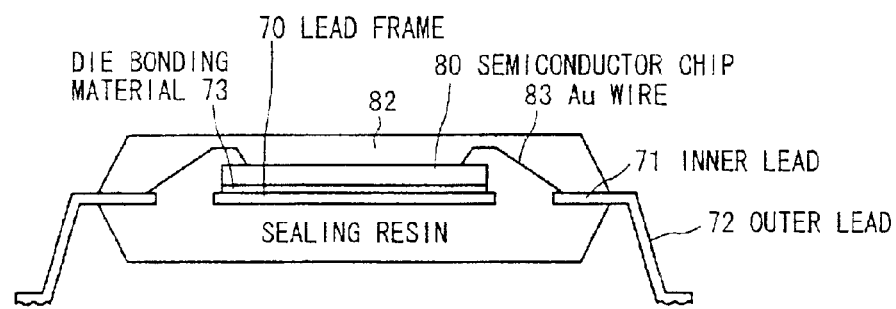
FIGS. 9A, 9B are cross-sectional views for showing a semiconductor device according to the third preferred embodiment of the invention.
Figure 9B:
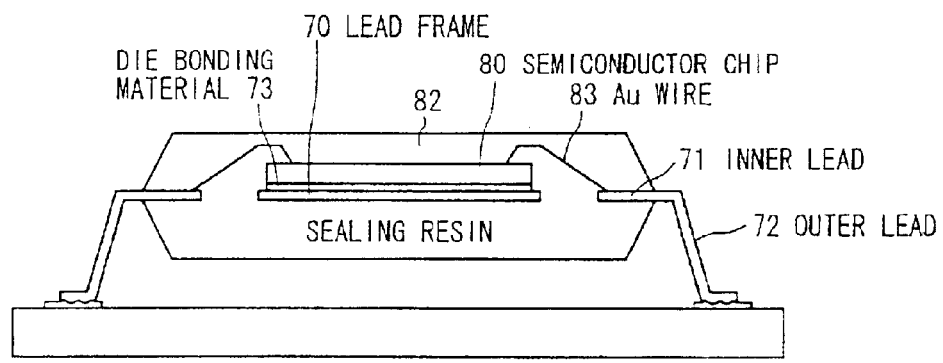

As shown in FIG. 9B, a semiconductor device according to the third preferred embodiment is provided with a lead frame 70, a semiconductor chip 80, and a printed circuit board 90.

The lead frame 70 is provided with inner leads 71 and outer leads 72, and the semiconductor chip 80 adheres to a central area of the lead frame 70 by means of die bonding material 73. A part of the inner lead 71 is plated with Au (not shown), and the Au-plated parts of the inner leads 71 are connected with pads 81 formed on the semiconductor chip 80 by Au wires (bonding wires) 83. The outer leads 72 are connected with pads 91 formed on a printed circuit board 90. Unevenness is formed on a contact surface between the pad 91 and the outer lead 72.

Next, a method for fabricating the semiconductor device according to the third preferred embodiment will be explained.

First, two parts of a bottom surface of the lead frame 70 on which the outer leads 72 are to be formed are grinded by a buff brush, and made rough. Thereby unevennesses are formed on the two predetermined parts of the lead frame 70 as shown in FIG. 7B. Subsequently, the lead frame 70 is so processed by using a metal mold that the inner leads 71 and the outer leads 72 are formed as shown in FIG. 7A. Thereafter, portions of the inner leads 71 which are to be electrically connected with the semiconductor chip 80 are plated with Au.

Figure 8:
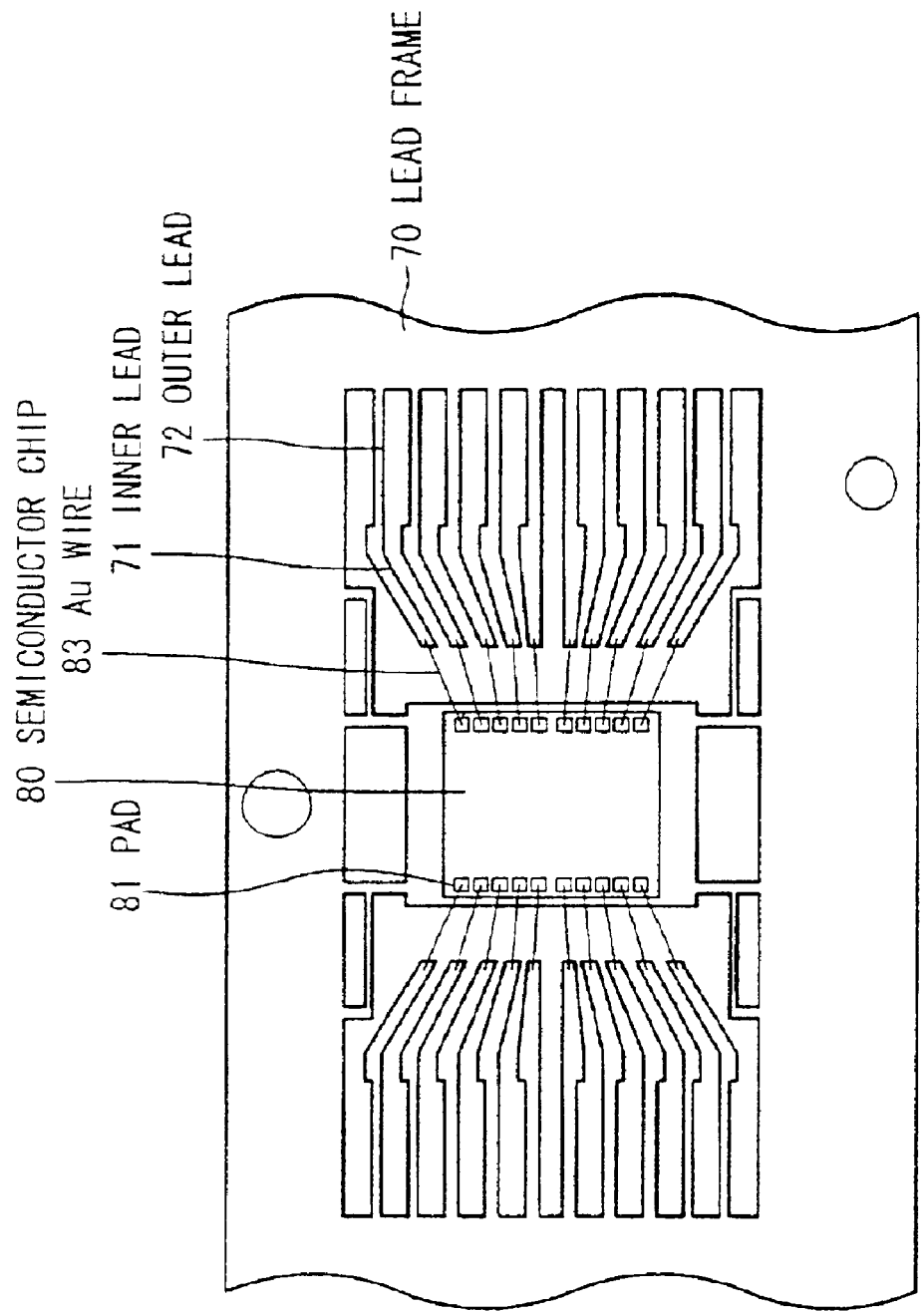
FIG. 8 is a plan view for showing a semiconductor device according to the third preferred embodiment of the invention.

Next, as shown in FIG. 8, the semiconductor chip 80 adheres to the central area of the lead frame 70 by means of die bonding material 73, and the pads 81 formed on the semiconductor chip 80 are connected with the inner leads 71 by the Au wires 83. Thereafter, the semiconductor chip 80 and the Au wires 83 are sealed with sealing resin 82.

Next, as shown in FIG. 9B, unnecessary parts of the lead frame 70 are punched by the metal mold, and predetermined portions of the outer leads are bent.

Finally, as shown in FIG. 9B, in order to assemble the lead frame 70 on which the semiconductor chip has been mounted into the printed circuit board 90, the position of the lead frame 70 relative to the printed circuit board 90 is adjusted, and the outer leads 72 are connected with the pads 91 formed on the printed circuit board 90 by thermal compression welding.

As mentioned in the above, since areas of the contact surfaces between the outer leads 72 and the printed circuit board 90 are increased by providing unevennesses for the surfaces of the outer leads 72, adhesive strength between the lead frame 70 and the printed circuit board 90 are heightened. Accordingly, the joined surfaces between the lead frame 70 and the printed circuit board 90 are prevented from being cracked because of impacts caused by failings, bendings, or thermal shocks. Accordingly, the semiconductor device operating in the electronic circuit with high reliability can be provided.

Although the surfaces of the outer leads 72 which are brought into contact with the printed board 90 are made rough in the aforementioned embodiment, the surface of the pads 91 formed on the printed circuit board 90 may be made rough. The surfaces of both the outer leads 72 and the pads 91 may be made rough as another choice.

As mentioned in the above, the high adhesive strength between the chip-mounting substrate and the printed circuit board or between the lead frame and the printed circuit board can be obtained according to the method for fabricating the semiconductor device proposed in the present invention. Moreover, the semiconductor device operating in the electronic circuit with high reliability can be obtained.

What is claimed is:

1. A semiconductor device, comprising:

a semiconductor chip;

a chip-mounting substrate which is provided with said semiconductor chip mounted on a top surface thereof and first conductive pads formed on a bottom surface thereof and connected with said semiconductor chip electrically;

solder balls formed on said first conductive pads;

a printed circuit board on which second conductive pads connected with said solder balls are formed;

a solder mask formed on a bottom surface of said chip-mounting substrate, said solder mask comprising a first uneven roughness; and underfill material injected into a clearance formed between said chip-mounting substrate and said printed circuit board, wherein said first uneven roughness is formed on a surface which is brought into contact with said underfill material, wherein said first uneven roughness increases an area of a contact surface between said chip-mounting substrate and the underfill material, wherein at least one of said first conductive pads and said second conductive pads comprises a second uneven roughness; and wherein said first uneven roughness and said second uneven roughness comprise substantially even spaced protrusions.

2. A semiconductor device according to claim 1, wherein said first uneven roughness is shaped into at least one of a slit-like configuration and a dimple-like configuration.

3. The semiconductor device according to claim 1, wherein said printed circuit board has a dimple-like shaped configuration.

4. The semiconductor device according to claim 1, wherein a surface of said chip-mounting substrate has a slit-like shaped configuration.

5. The semiconductor device according to claim 1, wherein said first uneven roughness is continuously formed on said solder mask.

6. A semiconductor device, comprising:
 a semiconductor chip;
 a lead frame which is provided with said semiconductor chip mounted thereon and electrically connected with said semiconductor chip; and
 a printed circuit board including conductive pads which are formed thereon and brought into direct contact with a bottom surface of said lead frame,
  wherein an uneven roughness exists on said bottom surface of said lead frame and a surface of said conductive pads, and
  wherein said uneven roughness comprises substantially even spaced protrusions.

7. The semiconductor device according to claim 6, wherein said lead frame comprises a lead, said lead comprises an inner lead portion connected to an outer lead portion, and said outer lead portion comprises said uneven roughness.

8. The semiconductor device according to claim 6, wherein said uneven roughness exists on contact surfaces between a pad of said printed circuit board and an outer lead of said lead frame.

9. The semiconductor device according to claim 6, wherein said lead frame comprises a lead, said lead comprises said bottom surface.

10. A semiconductor device comprising:
 a semiconductor chip;
 a chip-mounting substrate which is provided with said semiconductor chip mounted on a top surface thereof and first conductive pads formed on a bottom surface thereof and connected with said semiconductor chip electrically, said chip-mounting substrate including Cu wirings;
 solder balls formed on said first conductive pads;
 a printed circuit board on which second conductive pads connected with said solder balls are formed; and
 material injected into a clearance formed between said chip-mounting substrate and said printed circuit board,
  wherein a first uneven roughness is formed on a contact surface between said Cu wirings of said chip-mounting substrate and said solder balls,
  wherein said first uneven roughness exists on a bottom surface of said Cu wirings, and said Cu wirings are directly connected to said solder balls to form a joined surface,
  wherein said second conductive pads comprise a second uneven roughness in contact with said solder balls, and
  wherein said first uneven roughness and said second uneven roughness comprise substantially even spaced protrusions.

11. The semiconductor device according to claim 10, wherein said first uneven roughness is continuously formed on said bottom surface of said Cu wiring.

\* \* \* \* \*